(12) United States Patent
Lou

(10) Patent No.: US 12,117,484 B2
(45) Date of Patent: Oct. 15, 2024

(54) TEST DEVICE

(71) Applicant: teCat Technologies (Suzhou) Limited, Suzhou (CN)

(72) Inventor: Choon Leong Lou, Suzhou (CN)

(73) Assignee: teCat Technologies (Suzhou) Limited, Suzhou (CN)

( * ) Notice: Subject to any disclaimer, the term of this patent is extended or adjusted under 35 U.S.C. 154(b) by 0 days.

(21) Appl. No.: 17/890,702

(22) Filed: Aug. 18, 2022

(65) Prior Publication Data

US 2024/0036107 A1 Feb. 1, 2024

(30) Foreign Application Priority Data

Jul. 26, 2022 (CN) .......................... 202210886580.3

(51) Int. Cl.
*G01R 31/28* (2006.01)
*G01R 1/073* (2006.01)

(52) U.S. Cl.
CPC ..... *G01R 31/2889* (2013.01); *G01R 1/07314* (2013.01)

(58) Field of Classification Search
CPC .................. G01R 31/2889; G01R 1/07314
See application file for complete search history.

(56) References Cited

U.S. PATENT DOCUMENTS

| 5,210,485 A * | 5/1993 | Kreiger | G01R 1/07314 324/750.25 |
| 5,534,787 A * | 7/1996 | Levy | G01R 1/06772 324/755.05 |
| 2012/0115366 A1* | 5/2012 | Suzuki | G01R 1/07314 439/626 |
| 2015/0115989 A1* | 4/2015 | Okada | G01R 1/18 324/754.03 |

* cited by examiner

*Primary Examiner* — Eman A Alkafawi
*Assistant Examiner* — Suresh K Rajaputra
(74) *Attorney, Agent, or Firm* — Li & Cai Intellectual Property (USA) Office

(57) ABSTRACT

A test device for testing an object under test is provided. The test device includes a plurality of probe assemblies, a lower substrate, an upper substrate, a plurality of spacers, and a plurality of shielding structures. The lower substrate is used for being coupled to first contact ends of the plurality of probe assemblies. The upper substrate has a plurality of through holes. Second contact ends of the plurality of probe assemblies protrude from the upper substrate through these through holes, so as to be electrically connected to the object under test. The plurality of shielding structures is disposed between the lower substrate and the upper substrate. The plurality of shielding structures is resilient. The upper substrate, the lower substrate and the shielding structure define a plurality of accommodating regions, and each accommodating region is used for accommodating at least one of the probe assemblies.

17 Claims, 5 Drawing Sheets

TEST DEVICE

FIELD OF THE DISCLOSURE

The present disclosure relates to a test device, and in particular to a test device having a shielding structure.

BACKGROUND OF THE DISCLOSURE

After being formed by subjecting wafers to processes such as manufacturing and packaging of integrated circuits, chips are all required to undergo probe detection. The detection aims to filter out chips with a poor electrical function so as to avoid increasing the cost of subsequent manufacturing or scrapping. In the detection process, a detection machine transmits a test signal to the chips via a probe card, and receives a result signal returned by the chips via the probe card. However, in a high-frequency test environment, mutual interference occurs between a plurality of probes of the probe card during transmission of the test and result signals, leading to signal distortion or loss.

Therefore, how to avoid the problem of signal distortion caused by the interference between signals during chip testing by means of improvements in structural design has become one of the important issues to be solved in this field, so as to overcome the foregoing shortcomings.

SUMMARY OF THE DISCLOSURE

The technical problem to be solved by the present disclosure is to provide a test device in view of the shortcomings in the prior art, so as to avoid the technical problem of signal distortion caused by signal interference between a plurality of probes during chip testing.

To solve the foregoing technical problem, one technical solution adopted by the present disclosure is to provide a test device used for testing an object under test. The test device includes a plurality of probe assemblies, a lower substrate, an upper substrate, a plurality of spacers, and a plurality of shielding structures. Each probe assembly includes a first contact end and a second contact end. The lower substrate is used for being coupled to the first contact ends of the plurality of probe assemblies. The upper substrate has a plurality of through holes. The second contact ends of the plurality of probe assemblies protrude from the upper substrate through these through holes, so as to be electrically connected to the object under test. Each spacer is arranged between two adjacent through holes. The plurality of shielding structures is disposed between the lower substrate and the upper substrate. The plurality of shielding structures is resilient. The upper substrate, the lower substrate and the shielding structure define a plurality of accommodating regions, and each accommodating region is used for accommodating at least one of the probe assemblies.

The advantageous effects of the present disclosure are as follows: By means of the technical solutions that the plurality of shielding structures is resilient and is disposed between the lower substrate and the upper substrate, the test device provided by the present disclosure can reduce the interference between high-frequency signals during chip testing by the arrangement of the shielding structures.

To further understand the features and technical content of the present disclosure, reference is made to the following detailed description and drawings related to the present disclosure. However, the provided drawings are merely used for reference and description, and not intended to limit the present disclosure.

DETAILED DESCRIPTION OF THE EXEMPLARY EMBODIMENTS

Figure 1:
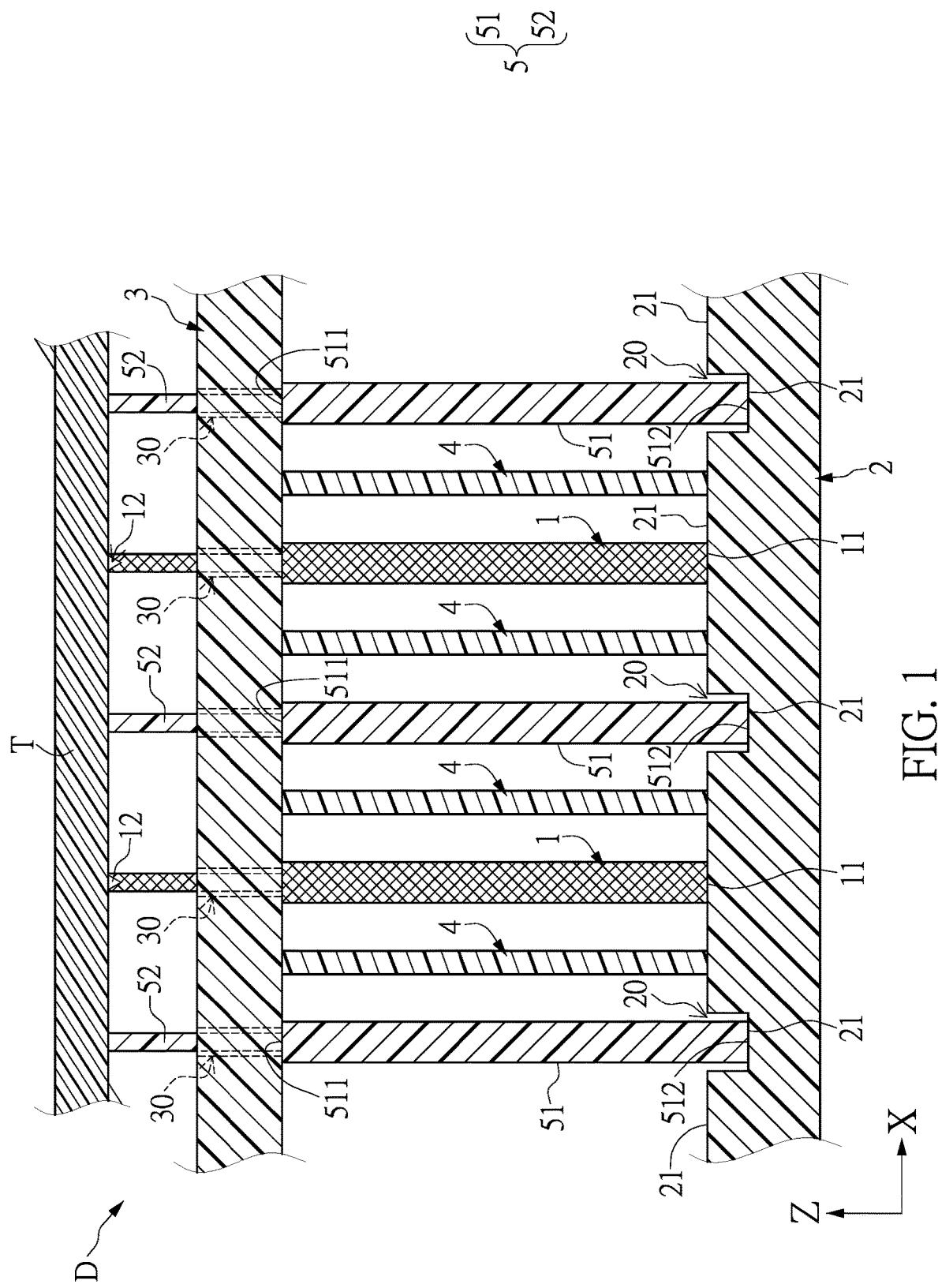
FIG. 1 is a schematic diagram of a test device in the XZ plane in a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The following describes an implementation manner of the present disclosure relating to a "test device" through specific embodiments. Those skilled in the art can easily understand the advantages and effects of the present disclosure from the content disclosed in the specification. The present disclosure can be embodied or applied through other different embodiments. Based on different opinions and applications, the details in the present specification can also be modified and changed without departing from the concept of the present disclosure. In addition, it should be stated first that the accompanying drawings of the present disclosure are merely for brief illustration and not drawn according to actual dimensions. The following embodiments will further explain the related technical content of the present disclosure in detail, but the disclosed content is not intended to limit the protection scope of the present disclosure. In addition, it should be understood that, although the terms "first", "second", "third", and the like are probably used herein to describe various elements, these elements should not be limited by these terms. The use of these terms only aims to distinguish one element from another. In addition, the term "or" as used herein shall, according to the actual situation, include any one or a combination of more of the associated listed items. In addition, the term "or" as used herein shall, according to the actual situation, include any one or a combination of more of the associated listed items.

First Embodiment

Referring to FIG. 1, FIG. 1 is a schematic diagram of a test device in the XZ plane in a first embodiment of the present disclosure. The first embodiment of the present disclosure provides a test device D used for testing an object T under test. The test device D includes a plurality of probe assemblies 1, a lower substrate 2, an upper substrate 3, a plurality of spacers 4, and a plurality of shielding structures 5.

As described above, each probe assembly 1 includes a first contact end 11 and a second contact end 12. The present disclosure does not limit the structure of the probe assembly 1, and the probe assembly 1 may be a resilient probe structure (for example, a pogo pin or other resilient probes). The lower substrate 2 is used for being coupled to the first contact ends 11 of the plurality of probe assemblies 1; and the upper substrate 3 has a plurality of through holes 30. For example, the upper substrate 3 may be a probe head or a guide plate, and the present disclosure is not limited thereto. The second contact ends 12 of the plurality of probe assemblies 1 protrude from the upper substrate 3 through these through holes 30, so as to be electrically connected to the object T under test. Each spacer 4 is arranged between two adjacent through holes 30. The spacer 4 is made of an insulating material, and is arranged between the probe assemblies 1 and the shielding structures 5. The plurality of shielding structures is disposed between the lower substrate 2 and the upper substrate 3. The upper substrate 3, the lower substrate 2 and the shielding structure 5 define a plurality of accommodating regions S, and each accommodating region S is used for accommodating at least one of the probe assemblies 1.

In the present disclosure, the plurality of shielding structures 5 is resilient. As shown in FIG. 1, each shielding structure 5 includes a resilient shield 51 and an extending portion 52. The resilient shield 51 is resilient. The extending portion 52 is formed at one end 511 of the resilient shield, and the other end 512 of the resilient shield 51 is pressed against the lower substrate 2. A plurality of through holes 30 respectively corresponding to the plurality of shielding structures 5 is further formed on the upper substrate 3. The extending portions 52 pass through the corresponding through holes 30 and protrude from the upper substrate 3, and extend towards the object T under test. In the present disclosure, the resilient shield 51 and the extending portion 52 may be integrally formed. In an embodiment, the resilient shield 51 and the extending portion 52 both have a function of shielding an electrical signal. In an embodiment, the resilient shield 51 and the extending portion 52 may be made of different materials.

Referring to FIGS. 1 to 4, FIG. 4 is a schematic diagram of one of implementation statuses of grooves of the test device of the present disclosure. The lower substrate 2 has a plurality of grooves 20 which respectively accommodate the plurality of shielding structures 5, and each groove 20 does not penetrate through the lower substrate 2. The end 512 of each resilient shield 51 that is pressed against the lower substrate 2 extends into the corresponding groove 20, such that the plurality of shielding structures 5 is stuck in these grooves 20. Further, the plurality of grooves 20 includes a plurality of first grooves 20A and a plurality of second grooves 20B, where these first grooves 20A are mutually parallel and these second grooves 20B are mutually parallel. For example, these first grooves 20A and these second grooves 20B are interlaced with each other or are mutually orthogonally arranged; and the present disclosure is not limited thereto.

Referring to FIGS. 1 to 5, FIG. 5 is a schematic diagram of one of implementation statuses of a shielding structure of the test device of the present disclosure. The plurality of resilient shields 51 are respectively corresponding to the plurality of grooves 20. Therefore, the plurality of resilient shields 51 may include first shields 51A and second shields 51B, where these first shields 51A are mutually parallel and these second shields 51B are mutually parallel. The first shields 51A and the second shields 51B may be interlaced with each other or are mutually orthogonally arranged.

Figure 5:
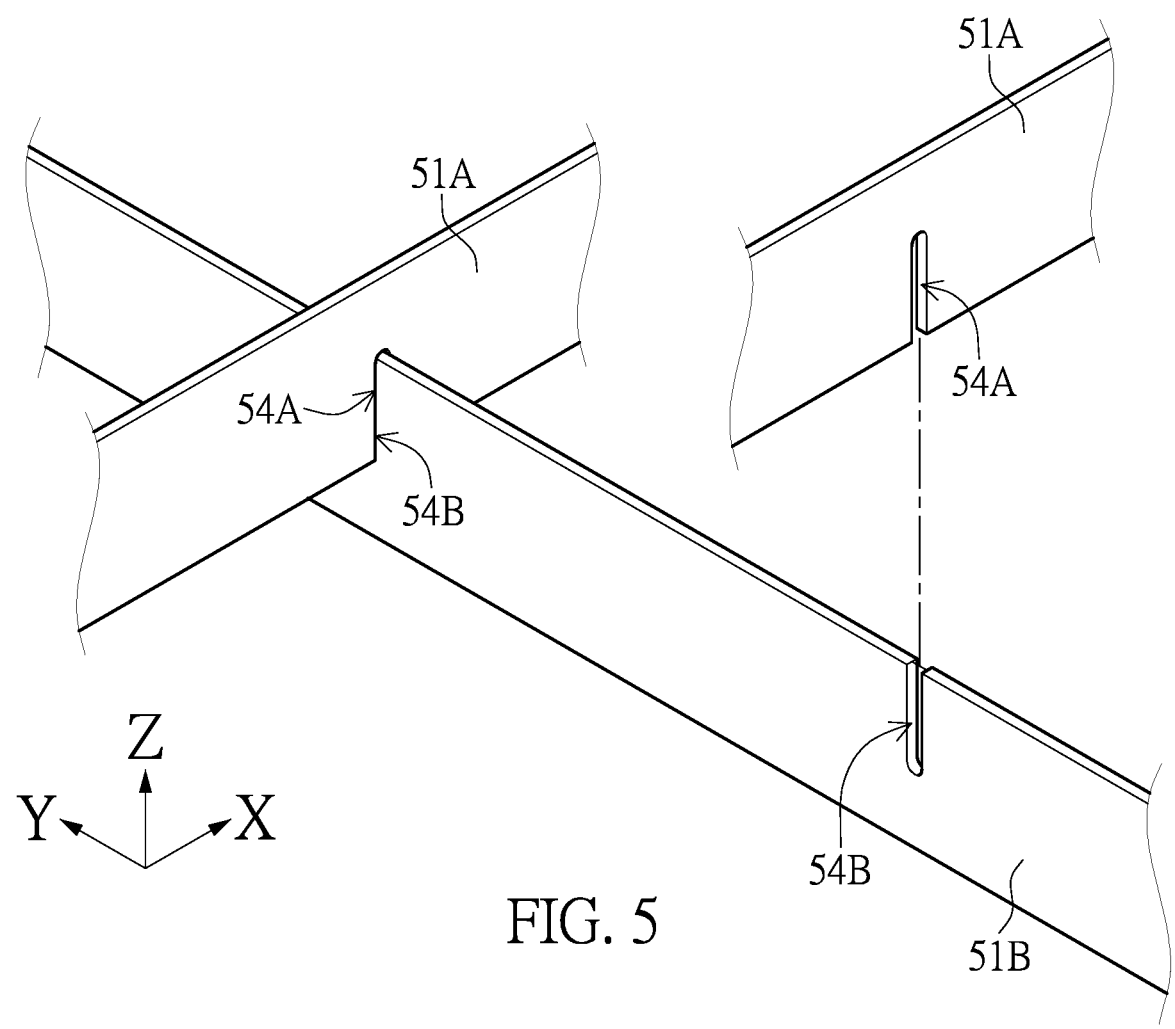
FIG. 5 is a schematic diagram of one of implementation statuses of a shielding structure of the test device of the present disclosure.

As shown in FIG. 5, each of the first shields 51A has a plurality of first clamping slots 54A and each of the second shields 51B has a plurality of second clamping slots 54B. The plurality of first clamping slots 54A are respectively corresponding to the plurality of second clamping slots 54B. The plurality of first shields 51A and the plurality of second shields 51B are fixed to each other by clamping the first clamping slots 54A to the second clamping slots 54B respectively. By the design of these first clamping slots 54A and these second clamping slots 54B, the plurality of first shields 51A and the plurality of second shields 51B can be firmly disposed on the lower substrate 2.

Referring to FIG. 1 continuously, when the plurality of probe assemblies 1 is electrically connected to the object T under test, a total length of the resilient shield 51 and the extending portion 52 is equal to the length of each probe assembly. More specifically, a total length of the resilient shield 51 and the extending portion 52 is equal to a distance from the upper surface 21 of the lower substrate 2 to the object T under test.

Second Embodiment

Figure 2:
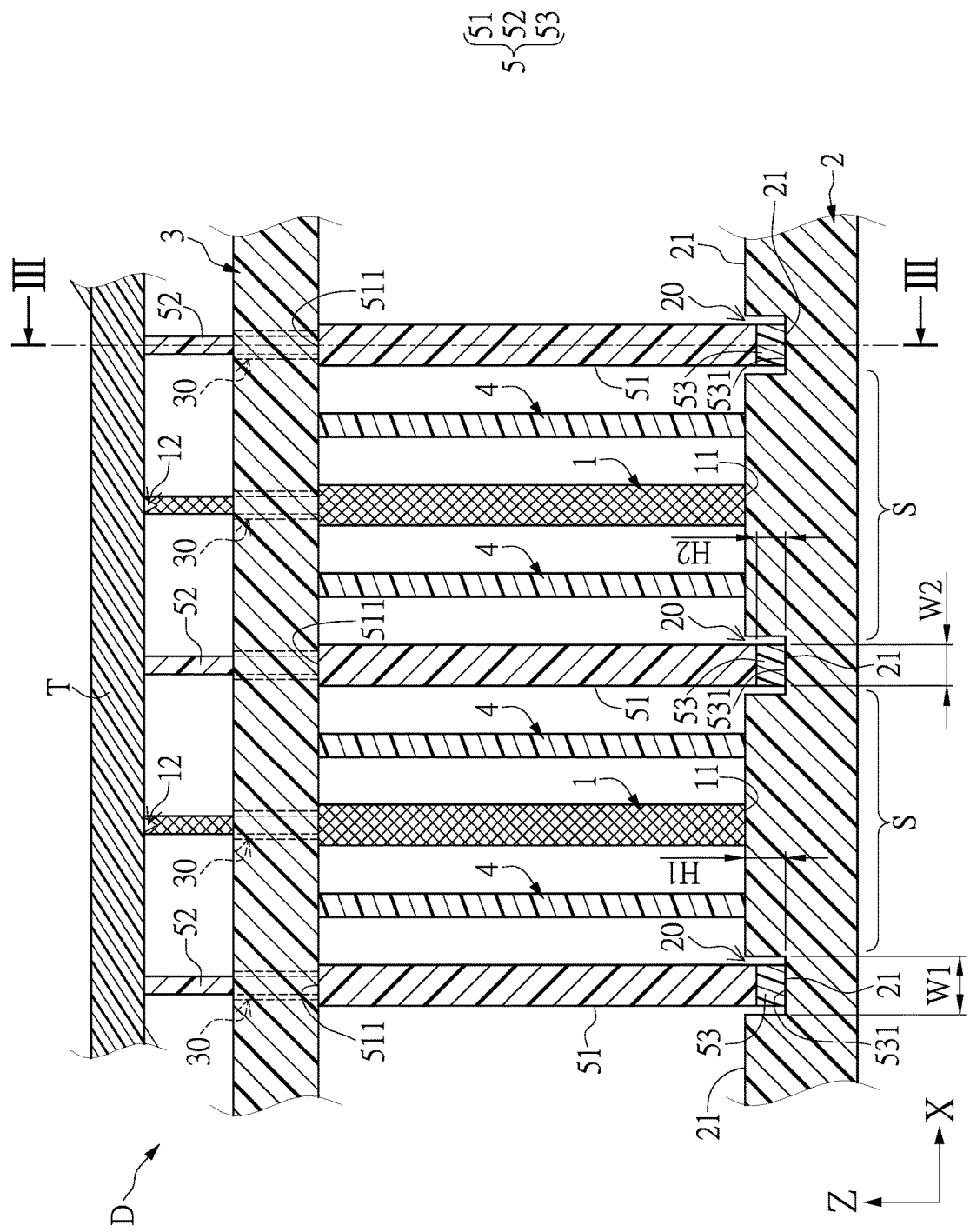
FIG. 2 is a schematic diagram of a test device in the XZ plane in a second embodiment of the present disclosure.
Figure 3:
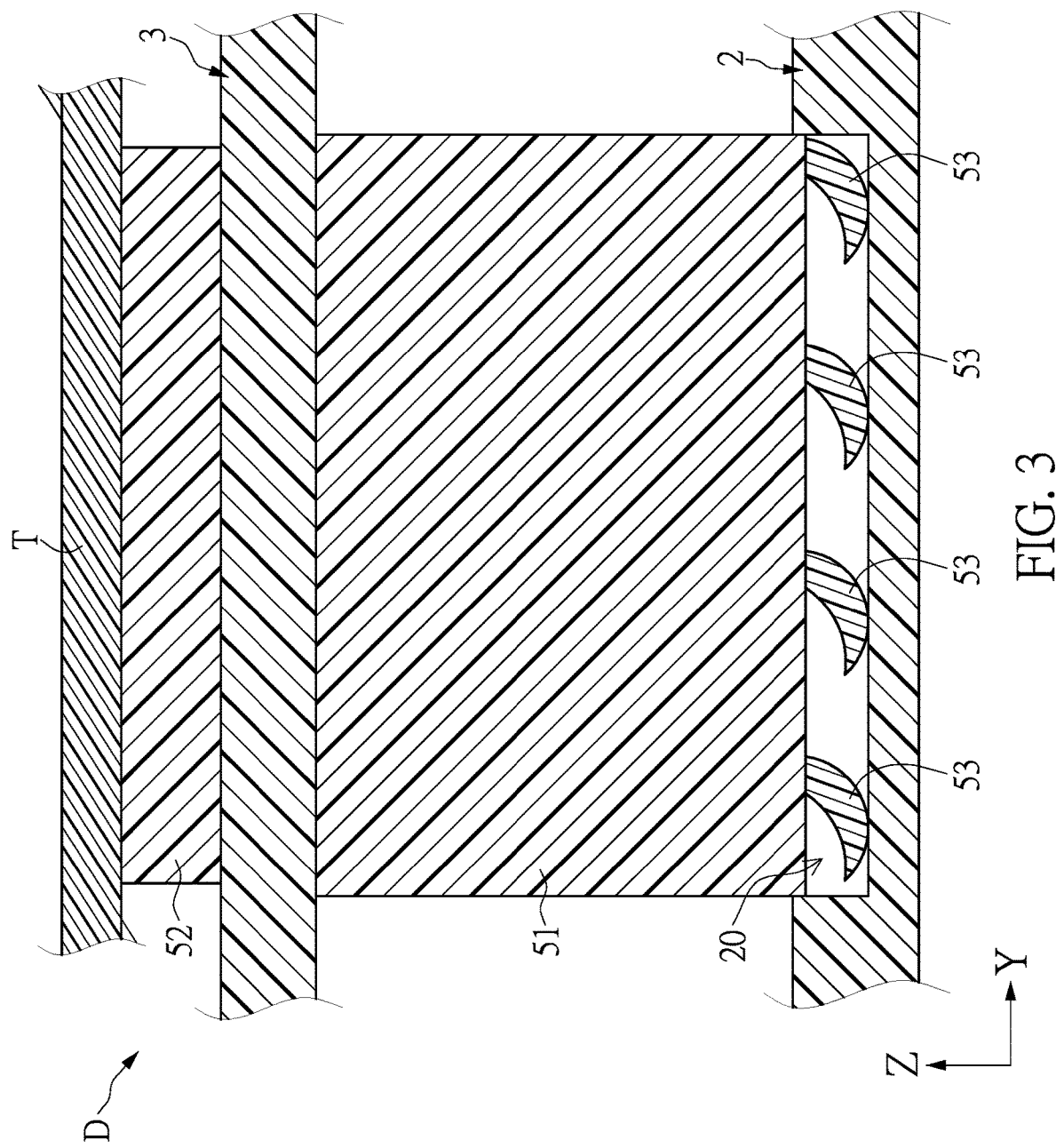
FIG. 3 is a schematic sectional diagram along in FIG. 2.
Figure 4:
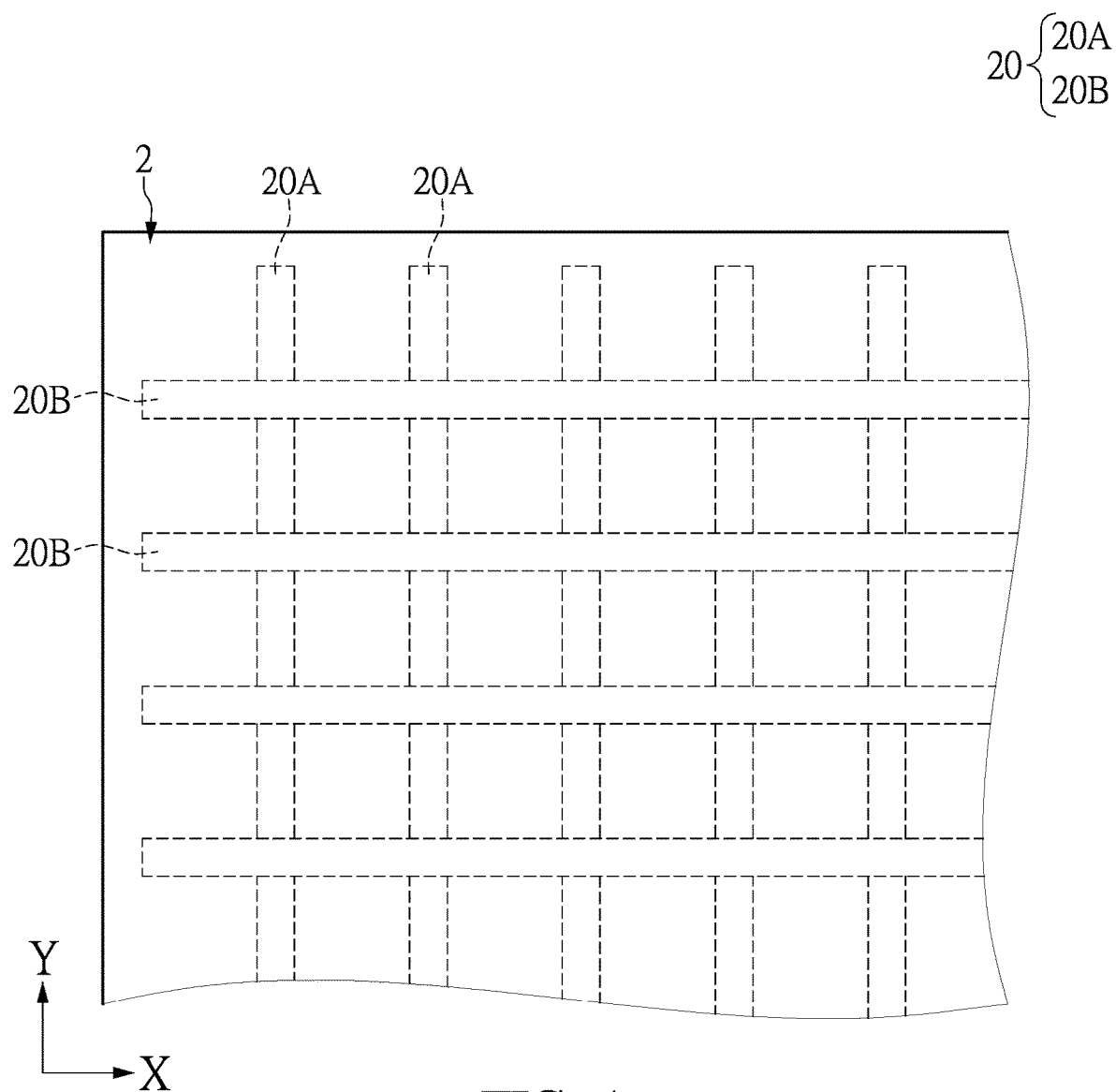
FIG. 4 is a schematic diagram of one of implementation statuses of grooves of the test device of the present disclosure.

Referring to FIGS. 2 and 3, FIG. 2 is a schematic diagram of a test device in the XZ plane in a second embodiment of the present disclosure, and FIG. 3 is a schematic sectional diagram along III-III in FIG. 2. The test device in this embodiment has a structure similar to that in the first embodiment, and their identical parts are not described herein again. Specifically, in this embodiment, each shielding structure 5 includes a resilient shield 51 and a plurality of resilient structures 53, where the plurality of resilient structures 53 is connected at the bottom of the resilient shield 51, and an end 531 of each resilient structure 53 that is far away from the bottom of the resilient shield 51 is pressed against the lower substrate 2. The lower substrate 2 includes a plurality of grooves 20 which are used to respectively accommodate the plurality of shielding structures 5, and each groove 20 does not penetrate through the lower substrate 2. The end 531 of each resilient structure 53 that is pressed against the lower substrate 2 extends into the corresponding groove 20, such that the plurality of shielding structures 5 is stuck in these grooves 20.

In one embodiment, the height H1 (in the Z-axis direction) of the resilient structure 53 is less than the depth H2 of the groove 20, and the width W1 (in the X-axis direction) of the resilient structure 53 is less than the width W2 of the groove 20. In one embodiment, the height H1 (in the Z-axis direction) of the resilient structure 53 is equal to the depth H2 of the groove 20. By the design of the groove 11, each shielding structure 5 can be firmly disposed on the lower substrate 2. In some embodiments, the distance from the resilient shield 51 to the lower substrate 2 (or to the bottom of the groove 20) depends on the height of the resilient structure 53. In addition, the resilient shield 51 and the resilient structure 53 may be integrally formed, or are separately made and then coupled together, and the present disclosure is not limited thereto. In an embodiment, the resilient structure 53 is also made of a conductive material. The shielding structure 5 and the resilient structure 53 may be made of the same or different materials, and the present disclosure is not limited thereto. In an embodiment, the resilient structure 53 is made of a non-conductive material, such as a porous resilient material, a honeycomb elastomer, or the like.

Because the test device of the present disclosure is applied in a test environment for transmission of high-frequency signals, the plurality of probes may interfere with each other during signal transmission. In addition, the test device also needs to undertake transmission of high-frequency signals, and thus signal interference is also inevitable. Therefore, the present disclosure separates the plurality of probe assemblies 1 by the arrangement of the shielding structures 5. The shielding structures 5 can be electrically connected to a ground potential, such that the shielding structures 5 can prevent signal interference between these probe assemblies 1 and impedance matching is achieved between the probe assemblies 1 and the shielding structures 5. By the arrangement of the shielding structures 5, the plurality of probe assemblies 1 can maintain the characteristic impedance for transmission of high-frequency signals. Therefore, the test device of the present disclosure can be used in a high-frequency test environment.

For example, there may be at least one probe assembly 1 in the accommodating region S between two adjacent shielding structures 5, and the present disclosure does not limit the number of the probe assemblies 1. When the accommodating region S accommodates one probe assembly 1, the probe assembly 1 and the near two shielding structures 5 at the left and right together form a probe structure for single-ended signaling. That is to say, the two adjacent shielding structures 2 are used for transmission of ground signals, and the probe assembly is used for transmission of the single-ended signal. On the other hand, when the accommodating region S accommodates two probe assemblies 1, the two probe assemblies 1 and the near two shielding structures 5 at the left and right together form a probe structure for differential signaling. That is to say, because differential signaling requires two signal lines, two probe assemblies 1 may be disposed in the accommodating region S between the two adjacent shielding structures 2. That is, the two adjacent shielding structures 2 are used for transmission of ground signals, and the two probe assemblies 1 are used for transmission of the differential signals.

In some embodiments, when the probe assemblies 1 contact the object T under test, the end of each shielding structure 5 that is far away from the lower substrate 2 or the extending portion 52 is pressed against the object T under test. In this way, during testing, the shielding structures 5 can provide a complete electric signal shielding effect for the probe assemblies 1. Because the shielding structures 5 are resilient, normal operation of the test device D and the electrical signal shielding effect can be ensured at the same time in the testing process.

Beneficial Effects of the Embodiments

The advantageous effects of the present disclosure are as follows: By means of the technical solutions that the plurality of shielding structures 5 is resilient and is disposed between the lower substrate 2 and the upper substrate 3, the test device D provided by the present disclosure can reduce the interference between high-frequency signals during chip testing by the arrangement of the shielding structures 5.

Furthermore, by the design of the grooves 20, the present disclosure enables each shielding structure 5 to be firmly disposed on the lower substrate 2. In addition, the overall elasticity of the shielding structure 5 can be strengthened by use of its own elasticity or by the design of the resilient structure 53, thus avoiding scratching caused by contact between the shielding structure 5 and the object T under test.

The above only discloses preferred and feasible embodiments of the present disclosure, and is not intended to limit the scope of the patent application of the present disclosure. Therefore, all equivalent technical changes made by using the contents of the description and drawings of the present disclosure are included in the scope of the patent application of the present disclosure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

Meanings of Numerals:
  D: Test device
  1: Probe assembly
  11: First contact end
  12: Second contact end
  2: Lower substrate
  20: Groove
  21: Upper surface
  20A: First groove
  20B: Second groove
  3: Upper substrate
  30: Through hole
  4: Spacer
  5: Shielding structure
  51: resilient shield
  51A: First shield
  51B: Second shield
  511: First end
  512: Second end
  52: Extending portion
  53: Resilient structure
  531: One end of the resilient structure
  54A: First clamping slot
  54B: Second clamping slot
  S: Accommodating region
  T: Object under test
  H1: Height
  H2: Depth
  W1, W2: Width

What is claimed is:

1. A test device, used for testing an object under test and comprising:
   a plurality of probe assemblies, each probe assembly comprising a first contact end and a second contact end;
   a lower substrate, used for being coupled to the first contact ends of the plurality of probe assemblies, wherein the lower substrate has a plurality of first grooves and a plurality of second grooves, the plurality of first grooves are mutually parallel to each other and the plurality of second grooves are mutually parallel to each other, and the plurality of first grooves and the plurality of second grooves are interlaced with each other;
   an upper substrate, having a plurality of through holes, wherein the second contact ends of the plurality of probe assemblies protrude from the upper substrate through these through holes, so as to be electrically connected to the object under test;
   a plurality of spacers, each spacer being disposed between two adjacent through holes; and
   a plurality of shielding structures, that are resilient, wherein each of the plurality of shielding structures extends along an extension direction of each of the plurality of probe assemblies;
   wherein each shielding structures includes at least one resilient shield, and the resilient shield is disposed between the upper substrate and the lower substrate and parallel to the plurality of probe assemblies,
   wherein the plurality of shielding structures includes a plurality of first shielding structures and a plurality of second shielding structures, the plurality of first shielding structures are mutually parallel to each other, and the plurality of second shielding structures are mutually parallel to each other, and the plurality of first shielding structures and the plurality of second shielding structures are interlaced with each other,
   wherein one end of each of the plurality of first shielding structures is pressed against the lower substrate and extends into a corresponding one of the plurality of first grooves, and one end of each of the plurality of second shielding structures is pressed against the lower substrate and extends into a corresponding one of the plurality of second grooves,
   wherein the upper substrate, the lower substrate, the plurality of first shielding structures, and the plurality of second shielding structures define a plurality of accommodating regions, and each accommodating region is used for accommodating at least one of the probe assembly.

2. The test device of claim 1, wherein each shielding structure further has an extending portion and the extending portion is formed on another end of the resilient shield; a plurality of through holes respectively corresponding to the plurality of shielding structures is further formed on the upper substrate; and the extending portions pass through the corresponding through holes and protrude from the upper substrate, and extend towards the object under test.

3. The test device of claim 2, wherein when the plurality of probe assemblies are electrically connected to the object under test, a total length of the resilient shield and the extending portion is equal to the length of each probe assembly.

4. The test device of claim 3, wherein the total length of the resilient shield and the extending portion is equal to a distance from an upper surface of the lower substrate to the object under test.

5. The test device of claim 1, wherein, when the one end of each resilient shield is pressed against the lower substrate and extends into the corresponding groove, the plurality of shielding structures are stuck in these grooves.

6. The test device of claim 1, wherein the plurality of first grooves and the plurality of second grooves are mutually orthogonally arranged.

7. The test device of claim 1, wherein when the plurality of probe assemblies are electrically connected to the object under test, a total length of the resilient shield and the extending portion is equal to the length of each probe assembly.

8. The test device of claim 7, wherein the total length of the resilient shield and the extending portion is equal to a distance from an upper surface of the lower substrate to the object under test.

9. The test device of claim 2, wherein when the probe assembly contacts the object under test, each extending portion is pressed against the object under test.

10. The test device of claim 1, wherein each shielding structure comprises a plurality of resilient structures, the plurality of resilient structures are connected at a bottom of the resilient shield, and an end of each resilient structure that is far away from the bottom of the resilient shield is pressed against the lower substrate.

11. The test device of claim 10, wherein, when the end of each resilient structure is pressed against the lower substrate extends into the corresponding groove, the plurality of shielding structures are stuck in these grooves.

12. The test device of claim 10, wherein a height of each resilient structure is less than or equal to a depth of each groove.

13. The test device of claim 10, wherein the plurality of first grooves and the plurality of second grooves are mutually orthogonally arranged.

14. The test device of claim 1, wherein when the accommodating region accommodates one probe assembly, the probe assembly and the near two shielding structures at the left and right together form a probe structure for single-ended signaling.

15. The test device of claim 1, wherein when the accommodating region accommodates two probe assemblies, the two probe assemblies and the near two shielding structures at the left and right together form a probe structure for differential signaling.

16. The test device of claim 1, wherein the lower substrate comprises a plurality of grooves used for respectively accommodating the plurality of shielding structures, and each groove does not penetrate through the lower substrate.

17. The test device of claim 1, wherein when the probe assembly contacts the object under test, an end of each shielding structure that is far away from the lower substrate is pressed against the object under test.

* * * * *